US012702048B2

(12) United States Patent
Lee et al.

(10) Patent No.:  US 12,702,048 B2
(45) Date of Patent:    Aug. 4, 2026

(54) ENCAPSULATED PACKAGE WITH EXPOSED ELECTRICALLY CONDUCTIVE STRUCTURES AND SIDEWALL RECESS

(71) Applicant: Infineon Technologies AG, Neubiberg (DE)

(72) Inventors: Chee Hong Lee, Paya Rumput (MY); Soon Lock Goh, Malacca (MY); Chai Chee Lee, Melaka (MY); Swee Kah Lee, Melaka (MY); Luay Kuan Ong, Melaka (MY); Chee Voon Tan, Seremban (MY)

(73) Assignee: Infineon Technologies AG, Neubiberg (DE)

( * ) Notice: Subject to any disclaimer, the term of this patent is extended or adjusted under 35 U.S.C. 154(b) by 461 days.

(21) Appl. No.: 18/144,578

(22) Filed: May 8, 2023

(65) Prior Publication Data

US 2024/0006260 A1      Jan. 4, 2024

(30) Foreign Application Priority Data

Jun. 29, 2022    (DE) ..................... 10 2022 116 198.6

(51) Int. Cl.
*H10W 74/10*          (2026.01)
*H10W 70/40*          (2026.01)
(Continued)

(52) U.S. Cl.
CPC ........ *H10W 74/111* (2026.01); *H10W 70/424* (2026.01); *H10W 70/481* (2026.01); *H10W 74/016* (2026.01); *H10W 90/811* (2026.01)

(58) Field of Classification Search
CPC .............. H01L 23/3107; H01L 21/565; H01L 23/49548; H01L 23/49562;
(Continued)

(56) References Cited

U.S. PATENT DOCUMENTS

| | | |
|---|---|---|
| 7,875,962 B2 | 1/2011 | Balakrishnan et al. |
| 11,211,373 B1 | 12/2021 | Bhalla et al. |

(Continued)

FOREIGN PATENT DOCUMENTS

| | | |
|---|---|---|
| DE | 102 47 610 | 4/2004 |
| DE | 10 2020 126 857 | 4/2022 |

(Continued)

*Primary Examiner* — Bitew A Dinke
(74) *Attorney, Agent, or Firm* — Dicke, Billig & Czaja, PLLC

(57) ABSTRACT

A package is disclosed. In one example, the package includes an electronic component and an encapsulant encapsulating at least part of the electronic component. A first electrically conductive structure is arranged on one side of the electronic component, a second electrically conductive structure arranged on an opposing other side of the electronic component and being electrically coupled with the electronic component, and at least one sidewall recess at the encapsulant. The first electrically conductive structure and the second electrically conductive structure are configured to be at different electric potentials during operation of the package. The first electrically conductive structure and the second electrically conductive structure are exposed at opposing main surfaces of the encapsulant.

18 Claims, 8 Drawing Sheets

(51) Int. Cl.
  *H10W 74/01*     (2026.01)
  *H10W 90/00*     (2026.01)

(58) Field of Classification Search
  CPC ........... H01L 23/49575; H01L 21/4825; H01L
        21/561; H01L 23/315; H01L 23/4334;
        H01L 23/3128; H01L 21/4821; H01L
        23/49565; H10W 74/111; H10W 70/424;
        H10W 70/481; H10W 74/016; H10W
        90/811; H10W 40/778; H10W 70/041;
        H10W 74/014; H10W 74/124; H10W
        70/04; H10W 74/117; H10W 70/438
  See application file for complete search history.

(56)          References Cited

U.S. PATENT DOCUMENTS

| | | | | |
|---|---|---|---|---|
| 12,374,631 | B2 * | 7/2025 | Shih ....................... H01L 23/562 |
| 2002/0027276 | A1 * | 3/2002 | Sakamoto ............... H01L 24/84 |
| | | | 257/E23.044 |
| 2005/0161785 | A1 * | 7/2005 | Kawashima ............ H01L 24/73 |
| | | | 257/E23.044 |
| 2009/0261468 | A1 * | 10/2009 | Kroeninger ........... H01L 25/072 |
| | | | 257/E23.001 |
| 2010/0025829 | A1 * | 2/2010 | Mengel ................. H01L 23/142 |
| | | | 257/676 |
| 2010/0258920 | A1 * | 10/2010 | Chien ................. H01L 23/3107 |
| | | | 438/123 |

| | | | | |
|---|---|---|---|---|
| 2011/0045634 | A1 * | 2/2011 | Pagaila ................... H01L 24/96 |
| | | | 438/107 |
| 2012/0061822 | A1 * | 3/2012 | Pagaila ................... H01L 24/16 |
| | | | 257/737 |
| 2013/0168839 | A1 | 7/2013 | Chao |
| 2013/0241030 | A1 * | 9/2013 | Do .......................... H01L 24/14 |
| | | | 257/522 |
| 2013/0292684 | A1 * | 11/2013 | Nikitin .................. H01L 23/488 |
| | | | 257/E29.089 |
| 2013/0334674 | A1 | 12/2013 | Zheng |
| 2015/0194362 | A1 * | 7/2015 | Otremba ................. H01L 24/18 |
| | | | 257/676 |
| 2016/0155713 | A1 * | 6/2016 | Kim .................... H01L 23/3121 |
| | | | 257/659 |
| 2017/0148746 | A1 * | 5/2017 | Chiu ....................... H01L 24/24 |
| 2017/0278768 | A1 * | 9/2017 | Higgins, III ........ H01L 21/4828 |
| 2020/0203302 | A1 * | 6/2020 | Chew ...................... H01L 24/73 |
| 2020/0303278 | A1 | 9/2020 | Salamone et al. |
| 2021/0020594 | A1 * | 1/2021 | Chiu ...................... H01L 24/19 |
| 2021/0335715 | A1 * | 10/2021 | Kao ................... H01L 21/4857 |
| 2021/0398951 | A1 | 12/2021 | Kakimoto et al. |
| 2022/0020605 | A1 * | 1/2022 | Essig ................. H01L 23/3107 |
| 2022/0102254 | A1 * | 3/2022 | Chew ..................... H01L 21/561 |
| 2022/0115245 | A1 | 4/2022 | Narayanasamy et al. |
| 2022/0367384 | A1 * | 11/2022 | Yen ................... H01L 23/49548 |
| 2023/0017013 | A1 * | 1/2023 | Hsieh ..................... H01L 21/56 |

FOREIGN PATENT DOCUMENTS

| | | |
|---|---|---|
| EP | 2 426 713 | 3/2012 |
| JP | H11-121485 | 4/1994 |

* cited by examiner

126

106
104

104

106/114

ENCAPSULATED PACKAGE WITH EXPOSED ELECTRICALLY CONDUCTIVE STRUCTURES AND SIDEWALL RECESS

CROSS-REFERENCE TO RELATED APPLICATION

This Utility Patent Applications claims priority to German Patent Application No. 10 2022 116 198.6 filed Jun. 29, 2022, which is incorporated herein by reference.

TECHNICAL FIELD

Various embodiments relate generally to a package, and a method of manufacturing a package.

BACKGROUND

Packages may be denoted as encapsulated electronic components with electrical connections extending out of the encapsulant which can be mounted to an electronic periphery, for instance on a printed circuit board.

Packaging cost is an important driver for the industry. Related with this are performance, dimensions and reliability. The different packaging solutions are manifold and have to address the needs of the application.

SUMMARY

There may be a need for a package with high electric reliability.

According to an exemplary embodiment, a package is provided which comprises an electronic component, an encapsulant encapsulating at least part of the electronic component, a first electrically conductive structure arranged on one side of the electronic component, a second electrically conductive structure arranged on an opposing other side of the electronic component and being electrically coupled with the electronic component, and at least one sidewall recess at the encapsulant, wherein the first electrically conductive structure and the second electrically conductive structure are configured to be at different electric potentials during operation of the package, and wherein the first electrically conductive structure and the second electrically conductive structure are exposed at opposing main surfaces of the encapsulant.

According to another exemplary embodiment, a method of manufacturing a package is provided, wherein the method comprises encapsulating at least part of an electronic component by an encapsulant, arranging a first electrically conductive structure on one side of the electronic component, arranging a second electrically conductive structure on an opposing other side of the electronic component so as to be electrically coupled with the electronic component, wherein the first electrically conductive structure and the second electrically conductive structure are configured to be at different electric potentials during operation of the package, and wherein the first electrically conductive structure and the second electrically conductive structure are exposed at opposing main surfaces of the encapsulant, and forming at least one sidewall recess at the encapsulant.

According to an exemplary embodiment, an encapsulated package is provided having two exposed electrically conductive structures at two opposing sides of an encapsulated electronic component. At a sidewall of the encapsulant, one or more recesses may be formed, preferably by removing material of one or more tie bars which may be connected temporarily to one of the electrically conductive structures during part of a manufacturing process. In view of said recess(es), a parasitic electric path for creepage current flowing unintentionally between the two exposed electrically conductive structures may be advantageously extended spatially and may be rendered more complicated, since such a creepage current would have to flow along an additional trajectory portion defined by the recess(es). Consequently, a package with a high electric reliability may be obtained, since creepage currents may be strongly suppressed. Preferably, said recess(es) may be formed by removing at least a part of tie bars interconnecting electrically conductive structures (such as die paddles) during a manufacturing process. Tie bar removal may also simplify a subsequent singulation of individual packages manufactured in a batch process.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figures 1, 2:
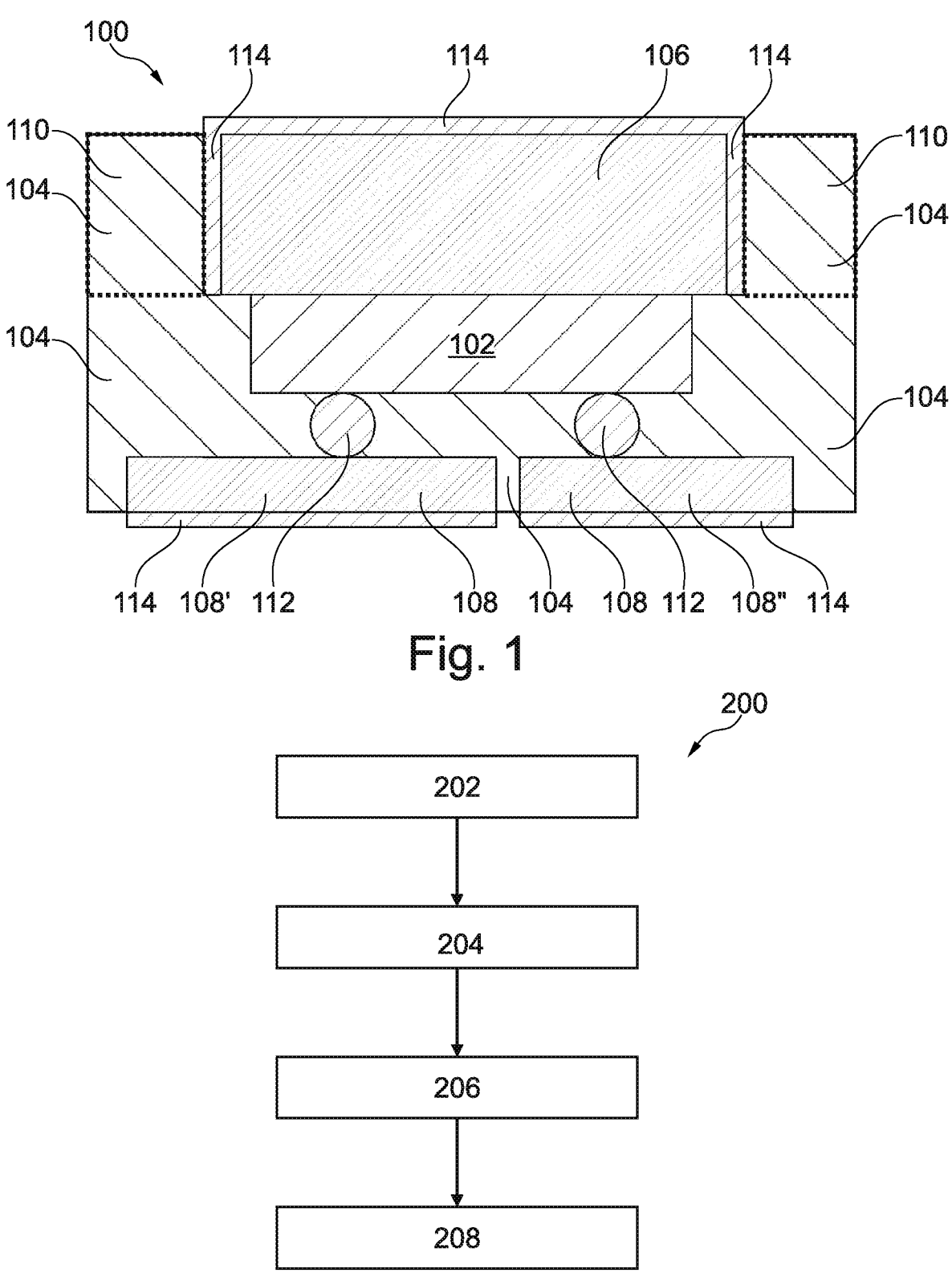
FIG. 1 illustrates a cross-sectional view of a package according to an exemplary embodiment.
FIG. 2 illustrates a flowchart of a method of manufacturing a package according to an exemplary embodiment.

In the following, further exemplary embodiments of the package and the method will be explained.

In the context of the present application, the term "package" may particularly denote an electronic device which may comprise one or more electronic components mounted on a (in particular carrier-type) electrically conductive structure. Said constituents of the package may be encapsulated at least partially by an encapsulant. Optionally, one or more electrically conductive interconnect bodies (such as metallic pillars, pumps, bond wires and/or clips) may be implemented in a package, for instance for electrically coupling and/or mechanically supporting the electronic component.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). However, in other embodiments, the electronic component may also be of different type, such as a mechatronic member, in particular a mechanical switch, etc. In particular, the electronic component may be a semiconductor chip having at least one integrated circuit element (such as a diode or a transistor in a surface portion thereof. The electronic component may be a bare die or may be already packaged or encapsulated. Semiconductor chips implemented according to exemplary embodiments may be formed in silicon technology, gallium nitride technology, silicon carbide technology, etc.

In the context of the present application, the term "encapsulant" may particularly denote a substantially electrically insulating material surrounding at least part of an electronic component and at least part of one or more electrically conductive structures to provide mechanical protection, electrical insulation, and optionally a contribution to heat removal during operation. In particular, said encapsulant may be a mold compound. A mold compound may comprise a matrix of flowable and hardenable material and filler particles embedded therein. For instance, filler particles may be used to adjust the properties of the mold component, in particular to enhance thermal conductivity.

In the context of the present application, the term "electrically conductive structure" may particularly denote a structure which serves as a mechanical support and/or an electric connection for at least one electronic component of a package. Therefore, a respective electrically conductive structure may be assigned to one individual package and may form part of said individual package. For example, such an electrically conductive structure may be or comprise a carrier (such as a die paddle), a plated body, a clip, etc. An electrically conductive structure may comprise or consist of a single part or multiple parts which may be joined via encapsulation or other package components.

In the context of the present application, the term "sidewall recess" may particularly denote an indentation, a groove, a notch, a hole (in particular a blind hole or a through hole) or a trench extending from a vertical or slanted sidewall of the package (in particular of the encapsulant) into an interior of the package. The sidewall recess may or may not extend to one or both of two opposing main surfaces of the package.

In the context of the present application, the term "electrically conductive structures configured to be at different electric potentials during operation of the package" may particularly denote that an electric circuitry of the at least one electronic component and the at least two electrically conductive structures of the package may be configured so that the different electrically conductive structures may be at different electric voltage levels when the package is operated. Hence, the first electrically conductive structure and the second electrically conductive structure do not form permanently equipotential surfaces. In other words, the exposed first electrically conductive structure and second electrically conductive structure may be electrically separately operable structures.

In the context of the present application, the term "exposed electrically conductive structures" may particularly denote that the respective electrically conductive structure has at least a surface portion which is not covered by the encapsulant. In contrast to this, said surface portion may be directly exposed to an electronic or thermal environment of the package. For instance, the exposed electrically conductive structure may be electrically connected to an electronic environment, for instance may be mounted on a mounting base such as a printed circuit board. It is also possible that an exposed electrically conductive structure is thermally coupled with a heatsink. For example, the exposed surface portion of the electrically conductive structure may be defined by a bulk metal (such as copper) or a surface finish (for example Electroless Nickel with Immersion Gold, ENIG).

In an embodiment, the at least one sidewall recess exposes a sidewall portion of the first electrically conductive structure. The first electrically conductive structure may be a carrier (such as a die paddle) on which the electronic component may be mounted during manufacture of the package. Such a carrier may form part of a larger physical body (for instance a leadframe) when a plurality of packages are formed simultaneously in a batch process. Tie bars may be provided for mechanically connecting the individual chip carrier-type first electrically conductive structures with each other before encapsulation. When a sidewall recess is formed so as to expose a sidewall of the carrier-type first electrically conductive structure, at least a portion of the corresponding tie bar may be removed for formation of the recess. Advantageously, this may significantly simplify and accelerate a subsequent singulation process by sawing, since the sawing process may be executed along a sawing line sawing through encapsulant material only, not through metallic material (of the tie bar).

In an embodiment, the at least one sidewall recess comprises at least two sidewall recesses arranged at opposing sidewalls of the encapsulant. Advantageously, this may extend the creepage distance at both opposing sidewalls of the encapsulant, thereby further improving the electric reliability of the package.

In an embodiment, the at least one sidewall recess comprises at least two sidewall recesses arranged mutually spaced at the same sidewall of the encapsulant. In particular when plural tie bars are provided along one side or edge of the carrier-type first electrically conductive structure, removal of said plural tie bars may further improve electric reliability. To put it shortly, this may prolong multiple parasitic creepage current paths simultaneously.

In an embodiment, the at least one sidewall recess extends up to one (in particular only one) of two opposing main surfaces of the encapsulant. Descriptively speaking, such a sidewall recess may extend into the package both from a lateral and from a vertical direction to form a groove. Such a design may allow to use the recess(es) as self-locking features during board soldering.

In an embodiment, the package is locally thinned at the at least one sidewall recess to a thickness of not more than 4 mm, in particular to a thickness in a range from 0.125 mm to 1 mm. Additionally or alternatively, a lateral depth of the at least one sidewall recess is not more than 4 mm, in particular is in a range from 0.1 mm to 4 mm. This may allow to obtain a compact design while simultaneously ensuring a sufficiently long creepage distance.

In an embodiment, the package comprises at least one electrically conductive coupling element coupling the electronic component with the second electrically conductive structure. For instance, such electrically conductive coupling elements may be metallic bumps and/or pillars.

In an embodiment, the first electrically conductive structure comprises a carrier, more specifically a chip carrier. In particular, such a carrier may carry the electronic component. Such a carrier-type electrically conductive structure may be a die paddle of a leadframe.

Figures 3, 4, 5, 6:
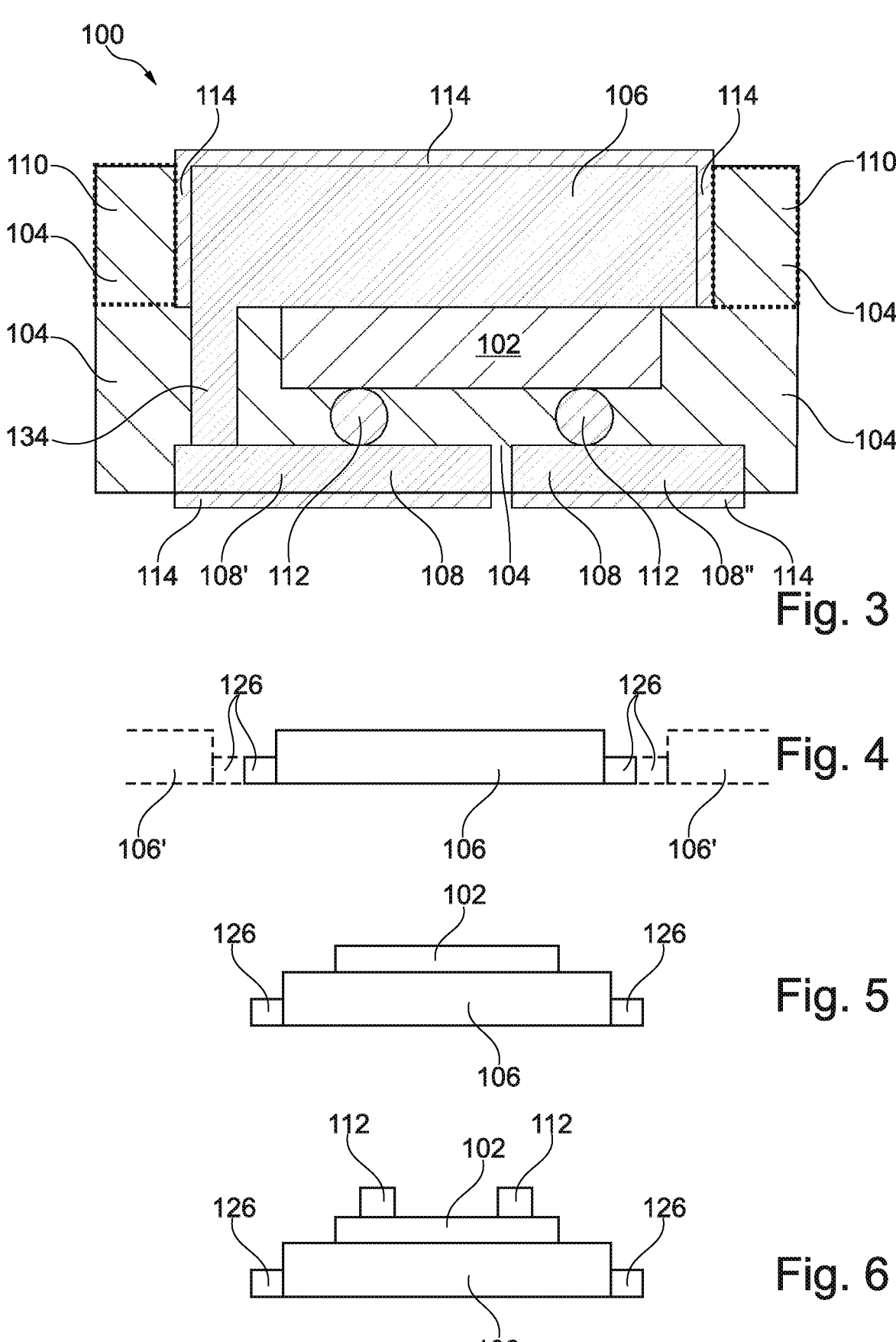
FIG. 3 illustrates a cross-sectional view of a package according to another exemplary embodiment.
FIG. 4 to FIG. 11 illustrate cross-sectional views of structures obtained during manufacturing a package, shown in FIG. 11, according to another exemplary embodiment.

In an embodiment, the first electrically conductive structure comprises a clip. Such an embodiment is shown in FIG. 3. A "clip" may particularly denote a three-dimensionally curved connection element with plate-shaped section and extension and may comprise an electrically conductive material (such as copper).

In an embodiment, the second electrically conductive structure comprises at least one plated structure. Such an embodiment is shown in FIG. 1. A plated structure may be a structure formed by plating, in particular by electroless plating and/or by electroplating. The plated second electrically conductive structure may also comprise plural sections which may be electrically decoupled from each other or coupled with each other. Alternatively, the second electrically conductive structure may not be formed by plating, but for instance as preformed metallic body/bodies or inlay/s.

In an embodiment, the encapsulant is a plateable mold compound. A plateable mold compound may in particular denote a mold compound configured for allowing plating of metallic material directly thereon. Plateability of a mold compound may also be promoted by depositing an appropriate surface coating. Advantageously, use of a plateable mold compound for manufacturing the package may allow to simply form the second electrically conductive structure directly on the encapsulant. This may significantly simplify the manufacturing process.

In an embodiment, an exposed portion of the first electrically conductive structure and/or an exposed portion of the second electrically conductive structure comprises a surface finish. A surface finish may denote a metallic or alloy-type coating of a metallic core body provided for functionalizing an electrically conductive surface thereof. In particular, a surface finish may be applied to ensure solderability and/or to protect exposed metallic circuitry.

In an embodiment, the package is tie bar-less. In other words, the package may be free of tie bars. Tie bars may be used for interconnecting constituents of different packages during manufacture. In many cases, tie bars are made of metal, and may for example form part of a leadframe. During separating individual packages manufactured in a batch procedure, said tie bars may be separated as well. However, cutting through metallic tie bar material may be cumbersome and may decelerate the separation process. Due to the manufacturing architecture of an exemplary embodiment, cutting through tie bars may be dispensable, since tie bars may be removed by formation of recesses before the packages are singularized. Although tie bars may form part of semifinished products or pre-forms of the readily manufactured package, they may be removed before completing manufacture of the packages during formation of the recess (es).

In another embodiment, the package comprises at least one tie bar stub (or residue) being integrally formed with the first electrically conductive structure and being exposed at the at least one sidewall recess. In such an alternative embodiment, a process for forming the recess(es) may complete material removal from the tie bar before it is entirely removed. Hence, a portion of the former tie bar, i.e. a stub thereof, may remain in the package and may be exposed at the respective recess.

In an embodiment, the electronic component comprises a transistor chip. In the context of the present application, the term "transistor chip" may particularly denote an electronic component which may be embodied in semiconductor technology and which may have at least one integrated transistor. The mentioned transistor may be a field effect transistor, an insulated gate bipolar transistor or another kind of bipolar transistor. It is possible that only the transistor is realized on the transistor chip as only integrated circuit element. It is however also possible that a diode (which can for instance be provided intrinsically by manufacturing a field effect transistor as such, or which may be manufactured separately from the transistor) forms part of the transistor chip. In yet another embodiment, at least one further active or passive integrated circuit element may be formed on a transistor chip.

In an embodiment, the first electrically conductive structure forms a source terminal and the second electrically conductive structure forms a drain terminal of the transistor chip. Optionally, the second electrically conductive structure may additionally form a gate terminal of the transistor chip. During operation of the package with transistor chip, source terminal and drain terminal should not be short-circuited by a creepage current flowing along an exterior surface of the package, since this might disturb the transistor function of the package or may even lead to a damage of the package. The provision of one or more sidewall recesses may spatially extend the creepage current path and may thereby increase the electric reliability of the transistor package.

In an embodiment, the package comprises a further transistor chip being at least partially encapsulated by the encapsulant. The two (or more) mentioned transistor chips may functionally cooperate within the package, for instance for forming a bidirectional switch, an inverter, or any other multi-transistor circuitry.

In an embodiment, the second electrically conductive structure additionally forms a source terminal of the further transistor chip. With this kind of circuitry, the one or more sidewall recesses may also protect the further transistor chip against an undesired impact of creepage current.

In an embodiment, the transistor chip and the further transistor chip have a common gate terminal and/or have a common drain terminal. This may lead to a compact design and short electric paths, thereby achieving high signal integrity and low ohmic losses. However, the source terminals of the transistor chip and of the further transistor chip may be separate from each other and may be electrically decoupled from each other.

In an embodiment, the first electrically conductive structure may be not electrically coupled with (i.e. may be electrically decoupled from) the electronic component. However, it is also possible that the first electrically conductive structure is electrically coupled with the electronic component.

In an embodiment, the method comprises forming the at least one sidewall recess by etching. Preferably, said etching process may be a chemical wet etching process (such as an acid etching process or an alkaline etching process). For instance, the etching process may be embodied as a spray etching process. By executing a tie bar removal process by etching, mechanically cutting through metallic tie bar material may be advantageously prevented. In particular, tie bar etching may significantly accelerate package singulation by mechanically sawing.

In an embodiment, the method comprises forming the at least one sidewall recess by removing material of a tie bar (which may temporarily interconnect the first electrically conductive structure with a further electrically conductive structure during part of the method of manufacturing the package). Hence, tie bars which may interconnect carrier-type first electrically conductive structures of different packages prior to encapsulation may be removed (preferably by etching) before singulating individual packages from a multi-package compound by sawing along sawing streets.

In an embodiment, the package comprises a plurality of (in particular electronic) components mounted between the electrically conductive structures or between different electrically conductive structures. Thus, the package may comprise one or more electronic components (for instance at least one passive component, such as a capacitor, and at least one active component, such as a semiconductor chip).

In an embodiment, an electronic device is provided which comprises the above-mentioned package and a mounting base (such as a printed circuit board, PCB) on which the package is mounted so as to be electrically coupled with the package. Such a mounting base may be an electronic board serving as mechanical base for the package.

In an embodiment, the package is configured as power module, for instance molded power module. For instance, an exemplary embodiment of the electronic system may be an intelligent power module (IPM). Another exemplary embodiment of the package is a dual inline electronic system (DIP).

In an embodiment, the electronic component is configured as a power semiconductor chip. Thus, the electronic component (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide). A semiconductor power chip may comprise one or more field effect transistors, diodes, inverter circuits, half-bridges, full-bridges, drivers, logic circuits, further devices, etc.

As substrate or wafer forming the basis of the electronic component(s), a semiconductor substrate, in particular a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

Conventionally, leadframe designs may involve tie bars for the purpose to connect unit to unit (i.e. different preforms of packages) in leadframe form. A package design based on such a leadframe concept may have to expose tie bars from sidewalls of packages after a package singulation process. Such an exposed tie bar may carry an electrical potential during operation of the package. Therefore, a creepage distance or a leakage distance due to an exposed tie bar may become critical. In particular, this may lead to a smaller design of input/output pads. This may result, in turn, in a poorer electrical and Thermal cycling on Board (TCoB) reliability. A further consequence may be a smaller heat slug dimension design which may lead to a limited thermal performance. Moreover, exposed tie bars may create a bigger package dimension design, which may increase the packaging effort.

In view of the foregoing, the present inventors have concluded that the design-related creepage distance for a semiconductor package may become a factor to be considered for preventing limited package performance, higher process effort and quality issue due to tie bars which may be exposed during a singulation process.

According to an exemplary embodiment, a package with encapsulated electronic component(s) and exposed first and second electrically conductive structures is provided. The latter may be arranged on opposing sides of the electronic component(s) and may be brought to different electric potentials or electric voltages. Advantageously, one or more sidewall recesses may be formed to extend into the encapsulant for increasing a creepage distance or leakage distance along an exterior surface of the encapsulant between the exposed electrically conductive structures on opposing sides of the package. Descriptively speaking, a parasitic creepage distance, flowing along an exterior surface of the encapsulant between the opposed electrically conductive structure, may be forced to flow along the recess and may therefore have to pass a longer and more complicated path compared with the absence of recesses. In a preferred embodiment, a tie bar-less package may be provided formed by post-mold etching.

More specifically, a semiconductor package may be formed without an exposed tie bar at a package sidewall. Such a package may be manufactured with exposed heatsink for improving the thermal reliability. In a preferred embodiment, no tie bar may be exposed at the package sidewall. Moreover, one or more recesses or trenches may be formed on a mold compound surface on top and/or bottom of the package. Apart from its advantageous function in terms of creepage current suppression, said at least one sidewall recess may also provide a self-locking feature during board soldering. Optionally, it may also be possible to form a fully plated LTI (lead tip inspection) like feature at an etched metal (for example a tie bar, a lead), etc.

Exemplary embodiments may offer advantages: Firstly, a high design flexibility may be achieved due to a relaxing of the creepage distance impact of a tie bar. Furthermore, the package design according to an exemplary embodiment may allow to provide bigger I/O pads and/or a bigger heat slug. Furthermore, smaller package dimensions may be achieved without compromising on electrical, thermal and mechanical reliability. Apart from this, higher voltage or current values may be supported during executing an application with the same package size. Furthermore, a better leadframe stability design during an assembly process may be achieved with tie bar support, wherein said tie bars may be removed partially or entirely by a post-mold etch later. Furthermore, a package design according to an exemplary embodiment may enable a high-throughput saw singulation process, since the presence of the one or more sidewall recesses may support a metal-less saw street design and improved reliability (in particular in terms of suppression of delamination, reduction of burrs, etc). Moreover, the manufacturing architecture of exemplary embodiments may reduce a plating effort due to the removal of non-active metal prior to a plating process.

FIG. 1 illustrates a cross-sectional view of a package 100 according to an exemplary embodiment.

The package 100 according to FIG. 1 comprises an electronic component 102, which may be embodied as a semiconductor transistor chip (in particular a metal oxide semiconductor field effect transistor chip manufactured in silicon technology). Although not shown in FIG. 1, a plurality of electronic components, in particular two transistor chips, may be encapsulated in a common package 100.

As shown as well in FIG. 1, an encapsulant 104 is provided which encapsulates the electronic component 102. For example, encapsulant 104 may be a mold compound.

Furthermore, package 100 comprises a first electrically conductive structure 106 arranged on one side of the electronic component 102. More specifically, the electronic component 102 may be mounted on the first electrically conductive structure 106, which may thus function as a chip carrier. In the embodiment of FIG. 1, the first electrically conductive structure 106 may for example be a die paddle forming part of a previous leadframe. For instance, the first electrically conductive structure 106 may be a metallic plate body, for instance made of copper. For example, the first electrically conductive structure 106 may not be electrically coupled with the electronic component 102. Alternatively, it is however possible that the first electrically conductive structure 106 is electrically coupled with the electronic component 102.

Furthermore, package 100 comprises a second electrically conductive structure 108, which is here composed of two separate plate elements 108', 108". As shown, the second electrically conductive structure 108' is located on an opposing other side of the electronic component 102, in comparison with the first electrically conductive structure 106. Each of the plate elements 108', 108" may be electrically coupled with an assigned terminal or pad of the electronic component 102. Each plate element 108', 108" of the second electrically conductive structure 108 may be a plated structure, which can be formed by electroless plating and/or electroplating directly on the encapsulant 104 when being embodied as a plateable mold compound.

Again referring to FIG. 1, the first electrically conductive structure 106 is exposed at an upper main surface of the package 100 and of the encapsulant 104, whereas the second electrically conductive structure 108 is exposed at the opposing lower main surface of the package 100 and the encapsulant 104.

As shown as well in FIG. 1, a respective sidewall recess 110 is formed at each of opposing vertical (or slanted) sidewalls of the encapsulant 104. Thus, FIG. 1 shows two sidewall recesses 110 arranged at opposing sidewalls of the encapsulant 104. The recesses 110 may be formed by removing material of tie bars (see for example reference signs 126 in FIG. 4 or FIG. 13) which may temporarily hold together different first electrically conductive structures 106 of a common leadframe used for manufacturing a plurality of packages 100 simultaneously. Consequently, each of the sidewall recesses 110 exposes a sidewall of the first electrically conductive structure 106. Apart from exposing sidewalls or sidewall portions of the first electrically conductive structure 106, each of the sidewall recesses 110 extends up to the upper main surface of the encapsulant 104. In comparison with a scenario in which metallic tie bars 126 (being connected with the first electrically conductive structure 106) are present in the sidewall recesses 110, a current path length of a parasitic creepage current flowing along an exterior surface of the package 100 between the first electrically conductive structure 106 and the second electrically conductive structure 108 may be spatially elongated. To put it shortly, the creepage distance may be increased by removing tie bars 126 by post mold etching. Descriptively speaking, a path length in the presence of the tie bars 126 compared with a path length in the absence of the tie bars 126 due to the formation of the sidewall recesses 110 may be shortened by a distance corresponding to a horizontal depth of the recesses 110. Thus, the provision of the sidewall recesses 110 by removing tie bars 126 may efficiently suppress creepage current flow and may thereby improve the electric reliability of the package 100. Hence, the package 100 of FIG. 1 is tie bar-less, because it does not comprise anymore any tie bar 126.

Due to the electric connection paths established in an interior of the package 100 in accordance with the electronic functionality of the package 100, the first electrically conductive structure 106 and the second electrically conductive structure 108 may be configured to be at different electric potentials or at different voltage levels during operation of the package 100. For instance in an embodiment in which the package 100 fulfills a transistor function, one of the first electrically conductive structure 106 and the second electrically conductive structure 108 may be a source terminal and the other one may be a drain terminal. In this context, it may be desired that the source potential differs from the drain potential and that no parasitic current flow occurs between source and drain. Such a parasitic current flow can be suppressed by the presence of the sidewall recesses 110 compared with a scenario in which they are filled with metallic tie bar material.

Package 100 additionally comprises electrically conductive coupling elements 112 each coupling the electronic component 102 with a respective plate element 108', 108" of the second electrically conductive structure 108. For example, the electrically conductive coupling elements 112 may be metallic bumps or pillars.

As shown as well in FIG. 1, each of an exposed portion of the first electrically conductive structure 106 and an exposed portion of the second electrically conductive structure 108 comprises a surface finish 114, for instance made of electroless nickel palladium gold (NiPAu) or electrolytic tin (Sn). When the core of the respective electrically conductive structure 106, 108 is made of copper, this may create a Cu—NiPAu or Cu—Sn connection. The surface finish 114 may be formed after creation of the sidewall recesses 110 so as to cover also exposed sidewalls of the first electrically conductive structure 106. In particular, the surface finish 110 may be applied to ensure solderability and/or to protect exposed metallic circuitry of the electrically conductive structures 106, 108.

Preferably, the tie bar-less configuration of package 100 may be achieved by executing a post mold etch. To put it shortly, the previously exposed tie bars 106 may be removed by chemically etching after having formed the encapsulant 104. A resist material may be only applied during a mask process, before etching, and may be stripped off after etching. Hence, resist material will not remain on the final package 100 in such an embodiment. The mentioned etching process may remove a tie bar 126 from a die paddle or a heatsink. After post mold etching, the individual packages 100 may be separated from a previous integral body by saw singulation. Due to the tie bar-less design with trenches or recesses 110, a sawing blade for singulation may have to pass through encapsulant material only, not through metallic material. This may accelerate the singulation process.

FIG. 2 illustrates a flowchart 200 of a method of manufacturing a package 100 according to an exemplary embodiment. The reference signs used for the following description of said manufacturing method relate to the embodiment of FIG. 1.

Referring to a block 202, the method comprises encapsulating at least part of an electronic component 102 by an encapsulant 104.

Referring to a block 204, the method furthermore comprises arranging a first electrically conductive structure 106 on one side of the electronic component 102.

Referring to a block 206, the method comprises arranging a second electrically conductive structure 108 on an opposing other side of the electronic component 102 so as to be electrically coupled with the electronic component 102. The first electrically conductive structure 106 and the second electrically conductive structure 108 may be configured to be at different electric potentials during operation of the package 100. Moreover, the first electrically conductive structure 106 and the second electrically conductive structure 108 are exposed at opposing main surfaces of the encapsulant 104.

Referring to a block 208, the method additionally comprises forming at least one sidewall recess 110 at the encapsulant 104.

FIG. 3 illustrates a cross-sectional view of a package 100 according to another exemplary embodiment.

The embodiment of FIG. 3 differs from the embodiment of FIG. 1 in particular in that, according to FIG. 3, the first electrically conductive structure 106 comprises a clip 134.

Figures 7, 8, 9, 10, 11, 12:
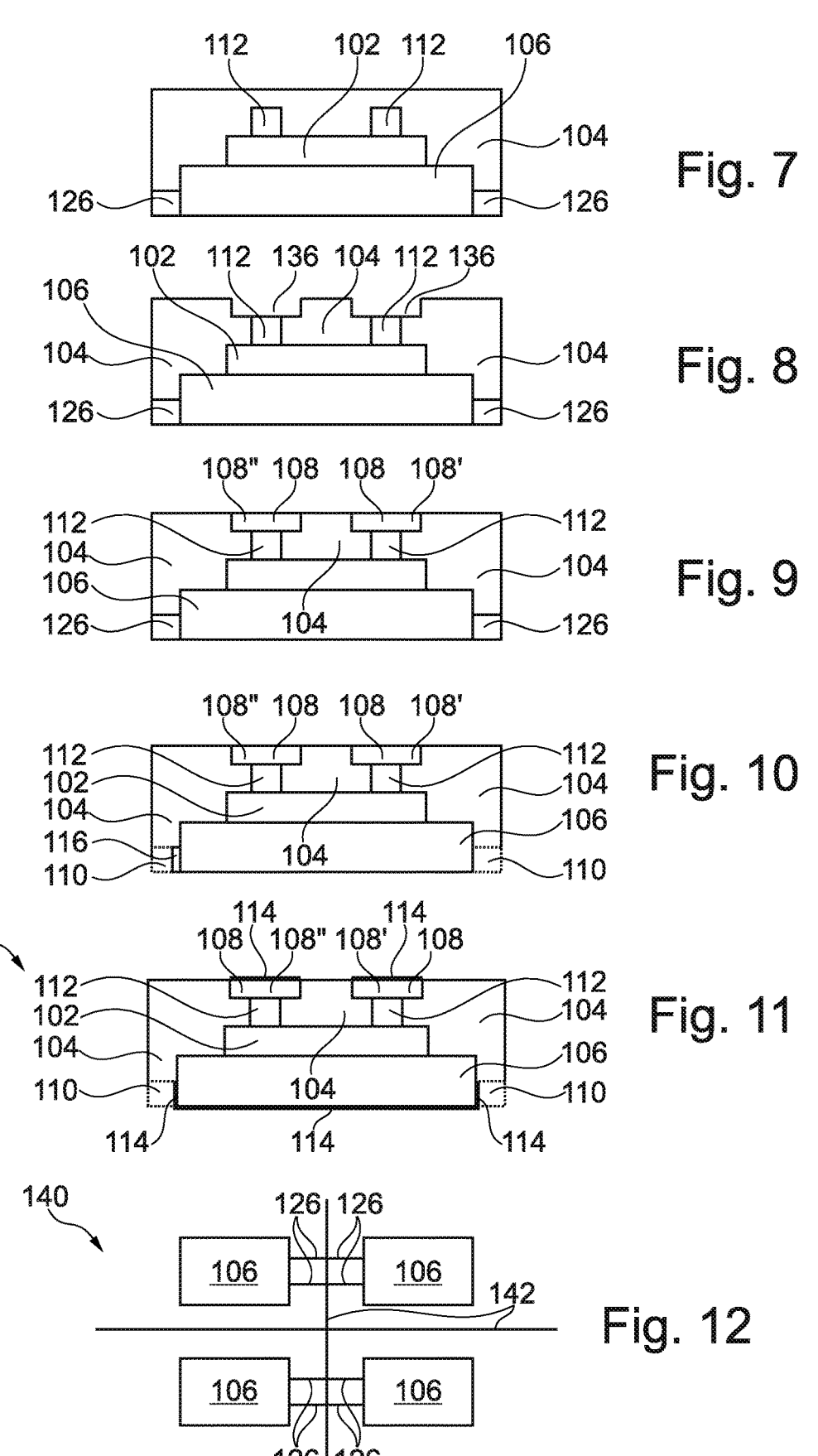
FIG. 12 illustrates a plan view of a leadframe used as a basis for manufacturing a package according to an exemplary embodiment.

FIG. 4 to FIG. 11 illustrate cross-sectional views of structures obtained during manufacturing a package 100, shown in FIG. 11, according to another exemplary embodiment.

FIG. 4 shows a cross-section of a metallic leadframe uses a basis for manufacturing a plurality of packages 100 in a common process. Said leadframe comprises a plurality of chip carrier-type first electrically conductive structures 106, 106' which are interconnected by a plurality of tie bars 126 to form an integral metallic body. As shown in FIG. 4, the tie bars 126 temporarily interconnect the first electrically conductive structure 106 with further electrically conductive structures 106' during part of the method of manufacturing packages 100.

Although the various preforms of packages 100 may remain interconnected by tie bars 126 until the latter are removed before a singulation process is executed at the end of the manufacturing process, interconnection between the various first electrically conductive structures 106, 106' by tie bars 126 is not illustrated for the sake of simplicity in FIG. 5 to FIG. 11.

Referring to FIG. 5, an electronic component 102 may be mounted on the first electrically conductive structure 106. Such a chip assembly may be executed, for example, by soldering, sintering or gluing.

Referring to FIG. 6, electrically conductive coupling elements 112, such as gold bumps or copper pillars, may be mounted on an exposed main surface of the electronic component 102 opposing a connection surface with the first electrically conductive structure 106.

Referring to FIG. 7, the electronic component 102, the electrically conductive coupling elements 112 and part of the first electrically conductive structure 106 including tie bars 126 are encapsulated by an encapsulant 104. For instance, this can be accomplished by molding.

Referring to FIG. 8, one or more cavities 136 may be formed in an upper main surface of encapsulant 104 for exposing the electrically conductive coupling elements 112. For instance, this can be accomplished by laser processing or by etching.

Referring to FIG. 9, the cavities 136 may be filled with electrically conductive material by plating, in particular electroless plating and/or electroplating. As a result, the second electrically conductive structure 108 is formed. As shown, the second electrically conductive structure 108 is thereby formed on an opposing other side of the electronic component 102, compared with the first electrically conductive structure 106. By the electrically conductive coupling elements 112, the second electrically conductive structure 108 is electrically coupled with the electronic component 102. The electric coupling of the electrically conductive structures 106, 108 in the package 100 being manufactured may be such that the first electrically conductive structure 106 and the second electrically conductive structure 108 are configured to be at different electric potentials during operation of the package 100. As shown, both the first electrically conductive structure 106 and the second electrically conductive structure 108 are exposed at opposing main surfaces of the encapsulant 104.

Alternatively, the second electrically conductive structure 108 may also be formed after the post mold etching process described below referring to FIG. 10. Furthermore, the second electrically conductive structures 108 may be formed on (rather than in) the encapsulant 104. It is also possible to connect one or more pre-formed metallic bodies as second electrically conductive structure 108 to the encapsulant 104 rather than forming the second electrically conductive structure 108 on a plateable mold compound.

Referring to FIG. 10, sidewall recesses 110 are then formed by removing exposed material of the tie bars 126 from opposing vertical sidewalls of the structure illustrated in FIG. 9. Preferably, this may be accomplished by etching.

In one embodiment, said material removal process may remove the entire tie bars 126 for creating a tie bar-less package 100. Alternatively, it may be possible to remove only part of the tie bars 126 so that shortened tie bar stubs 116 remain integrally connected to the first electrically conductive structure 106 adjacent to a respective recess 110. These tie bar stubs 116 may form part of the readily manufactured package 100 and may be exposed at the sidewall recesses 110.

Referring to FIG. 11, exposed surface areas of the electrically conductive structures 106, 108 may then be plated with a metal or an alloy to thereby form surface finish 114.

FIG. 12 illustrates a plan view of a leadframe 140 used as a basis for manufacturing packages 100 according to an exemplary embodiment.

As shown, a plurality of carrier-type first electrically conductive structures 106 of leadframe 140 are arranged in a matrix-like pattern in rows and columns. For interconnecting the first electrically conductive structures 106, horizontal and vertical strips 142 as well as tie bars 126 interconnect to the various first electrically conductive structures 106.

After encapsulation and prior to completion of the process of manufacturing packages 100, the tie bars 126 may be removed by etching, and the individual packages 100 may be singulated by sawing along sawing streets extending through encapsulant material only.

Figures 13, 14, 15:
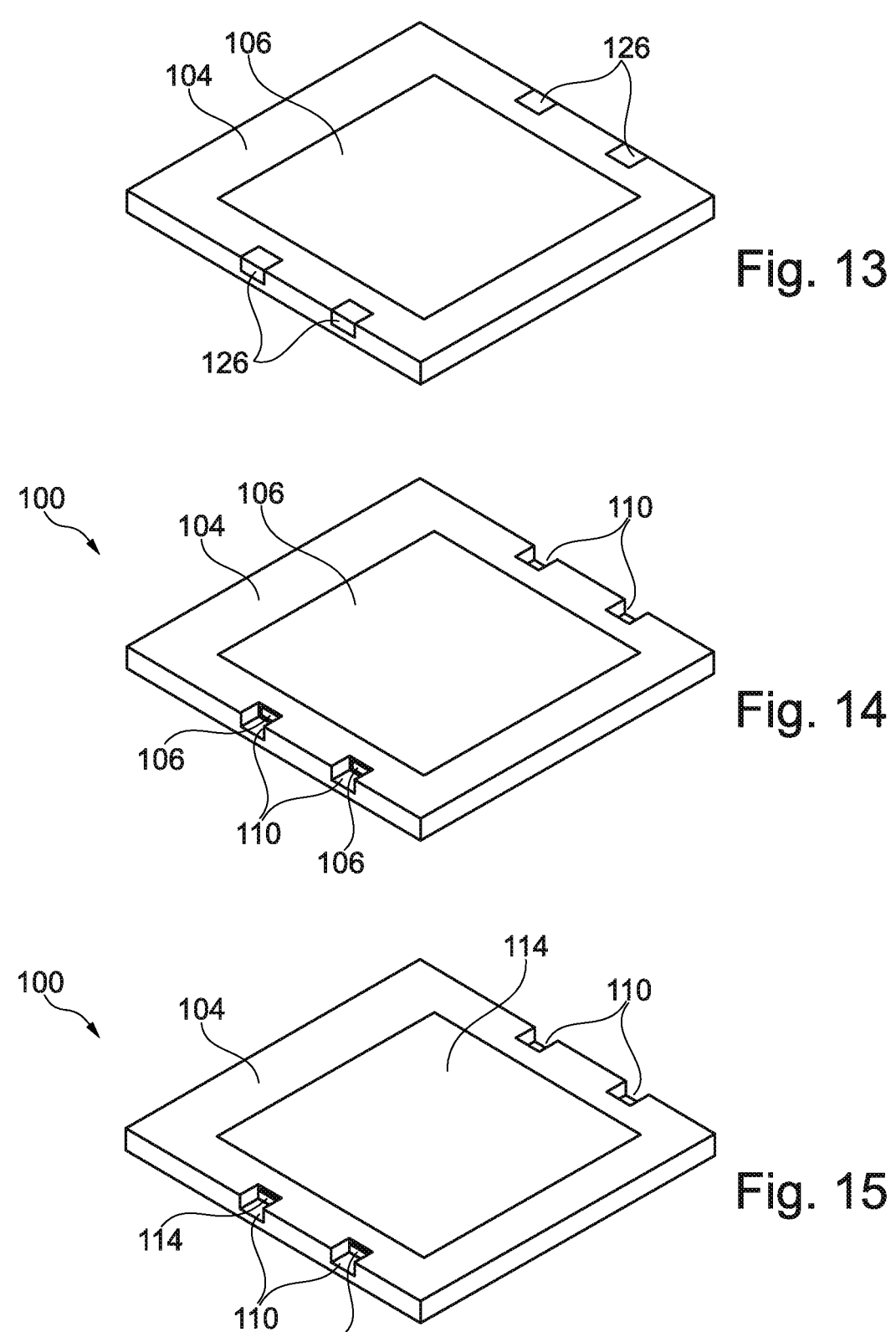
FIG. 13 to FIG. 15 illustrate three-dimensional views of structures obtained during manufacturing a package, shown in FIG. 14 and FIG. 15, according to another exemplary embodiment.

FIG. 13 to FIG. 15 illustrate three-dimensional views of structures obtained during manufacturing a package 100, shown in FIG. 14 and FIG. 15, according to another exemplary embodiment.

Referring to FIG. 13, a preform of package 100 is shown after molding and before formation of sidewall recesses 110. Hence, the manufacturing state according to FIG. 13 corresponds substantially to the one of FIG. 9.

Referring to FIG. 14, package 100 is shown after copper etching for removing tie bars 126 of the preform of FIG. 13. According to FIG. 14, two sidewall recesses 110 are arranged mutually spaced at the same sidewall of the encapsulant 104. A corresponding pair of sidewall recesses 110 is shown on two opposing sides of package 100.

The obtained semiconductor package 100 with exposed heatsink has no tie bars 126 exposed at the sidewalls of the package 100. Trenches or recesses 110 are created on a compound surface on the top (additionally or alternatively on the bottom) of the package 100. This extends the creepage distance, provides a self-locking feature during board soldering, and provides also a fully plated LTI like feature at the etched former tie bar 126.

Referring to FIG. 15, package 100 of FIG. 14 is shown after optional plating. Hence, package 100 may (FIG. 15) or may not (FIG. 14) be provided with a surface finish 114 on exposed metallic surfaces or part thereof.

Figures 16, 17, 18, 19:
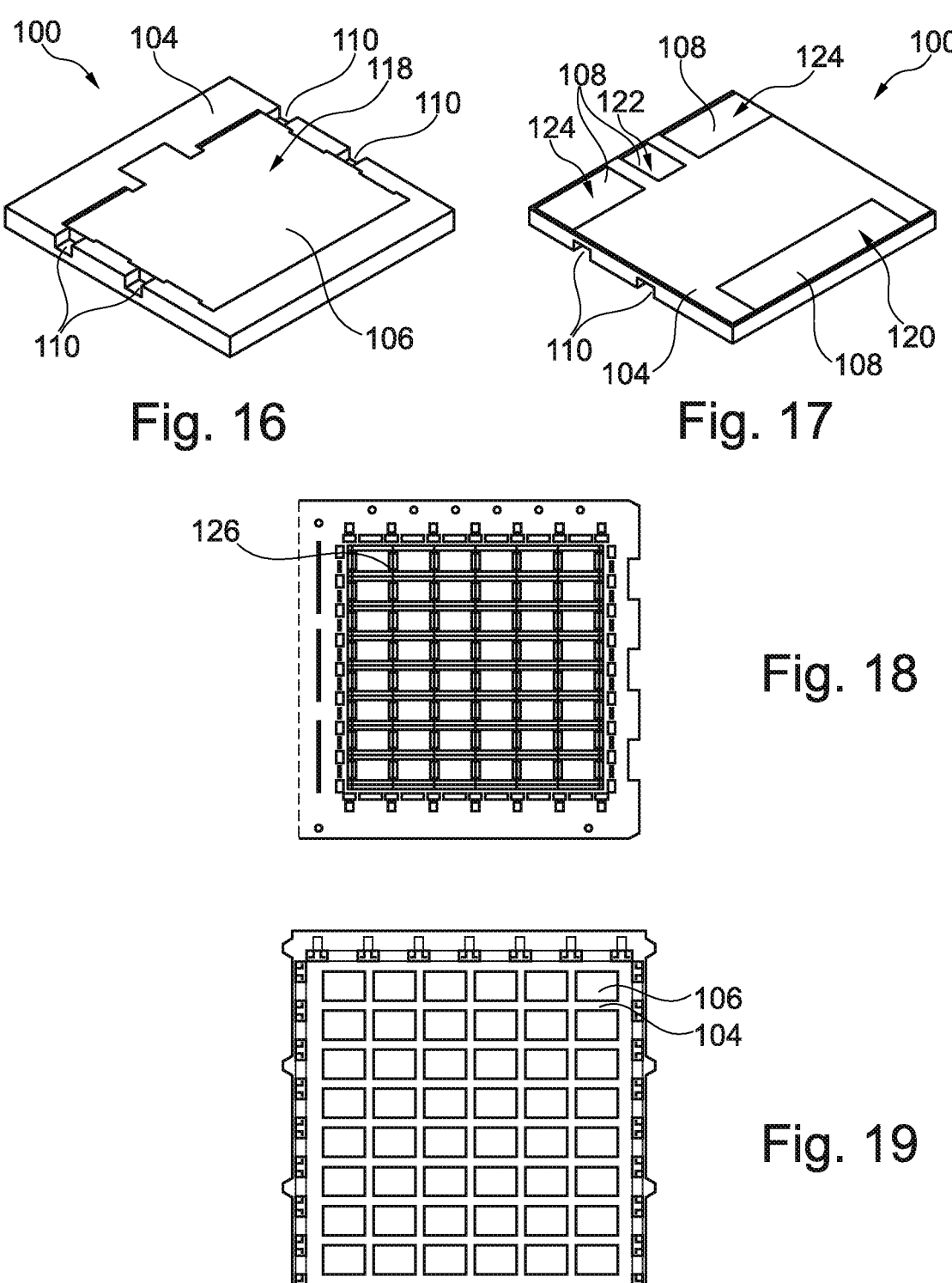
FIG. 16 and FIG. 17 illustrate top and bottom side three-dimensional views of a package according to another exemplary embodiment.
FIG. 18 to FIG. 23 illustrate different views of structures obtained during manufacturing packages, shown in FIG. 23, according to another exemplary embodiment.

FIG. 16 and FIG. 17 illustrate top and bottom side three-dimensional views of a package 100 according to another exemplary embodiment. Inside of package 100, a first transistor chip may be encapsulated as electronic component and a second transistor chip (not shown) may be encapsulated as further electronic component in encapsulant 104.

In the configuration of FIG. 16 and FIG. 17, the exposed first electrically conductive structure 106 forms a source terminal 118 which also functions as a heatsink or heatsink interface. The exposed second electrically conductive structure 108 forms a drain terminal 120 of the transistor chip. Moreover, the second electrically conductive structure 108 additionally forms a gate terminal 122 of the transistor chip. Apart from this, the second electrically conductive structure 108 additionally forms a source terminal 124 of the further transistor chip. In the shown configuration, the transistor chip and the further transistor chip have a common gate terminal 122 and have a common drain terminal 120.

Figure 21:
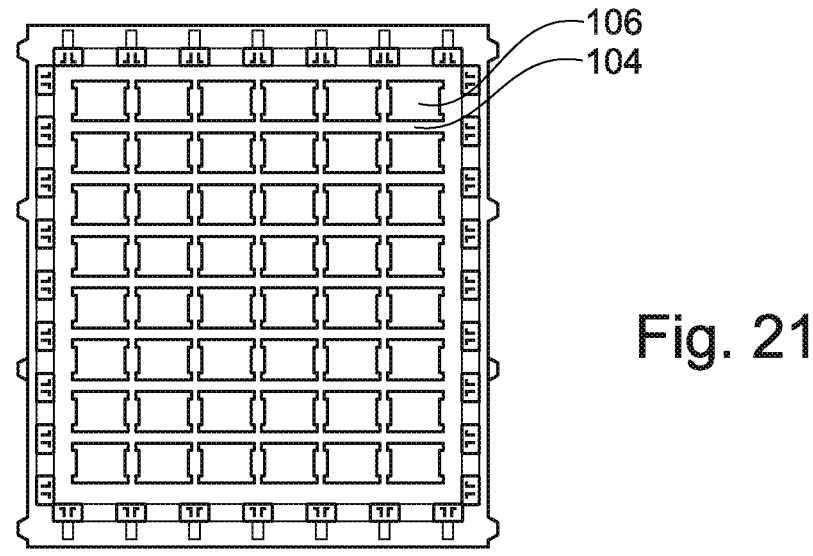
Figure 22:
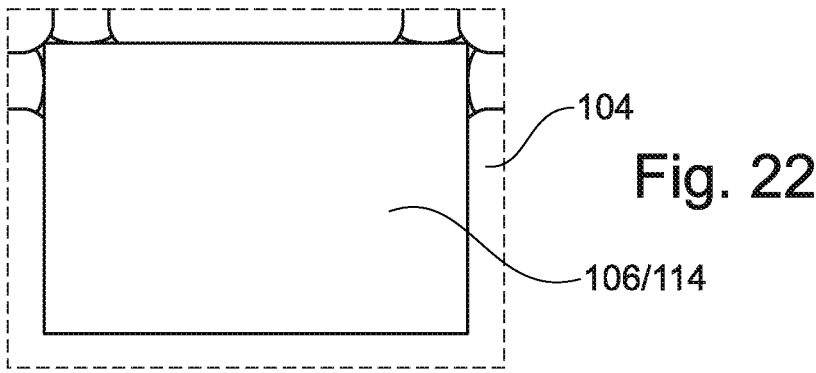
Figures 23, 24:
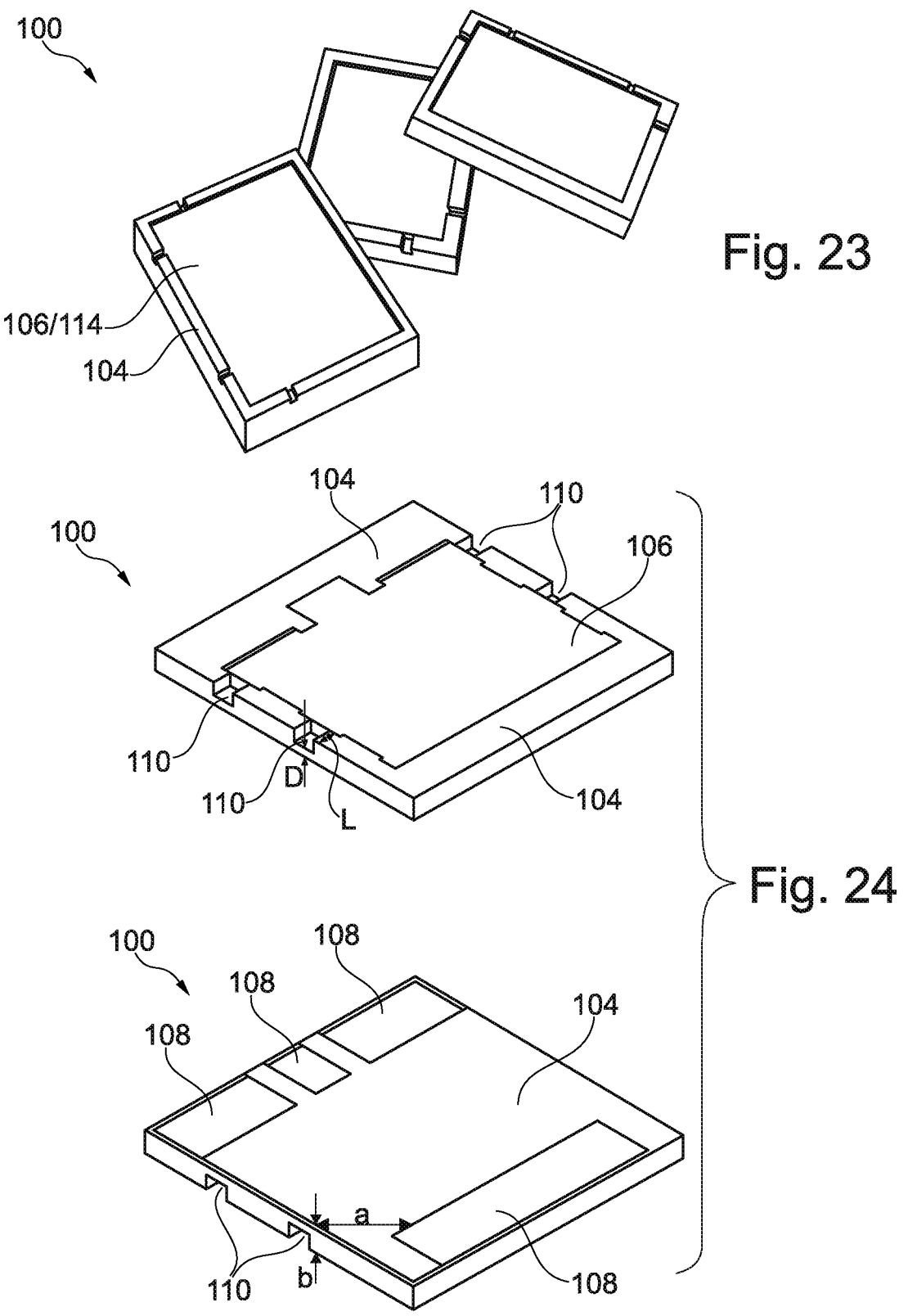
FIG. 24 illustrates three-dimensional top and bottom views of a package according to another exemplary embodiment.

FIG. 18 to FIG. 23 illustrate different views of structures obtained during manufacturing packages 100, shown in FIG. 23, according to another exemplary embodiment.

An assembly flow of such a manufacturing process comprises a die attach process followed by bump formation (or wire bonding). Thereafter, molding may be carried out. After that, a deflashing process may be executed for exposing mold-covered exterior surfaces of electrically conductive structures.

Thereafter, post mold selective etching may be executed, see FIG. 18 to FIG. 21. In this context, a full etching process may be applied to remove tie bar 126 and railing. After a final plating process, the individual packages 100 may be singulated by sawing, compare FIG. 21 and FIG. 22.

Referring to FIG. 18, a selective masking process may be realized for example by ink-jet printing for covering the electrically conductive structures during post mold etching of the tie bars 126.

Referring to FIG. 19, a full etch may be executed, which may be wet or chemical etching (in acid or alkaline milieu). As a result, the tie bars 126 are removed.

Figure 20:
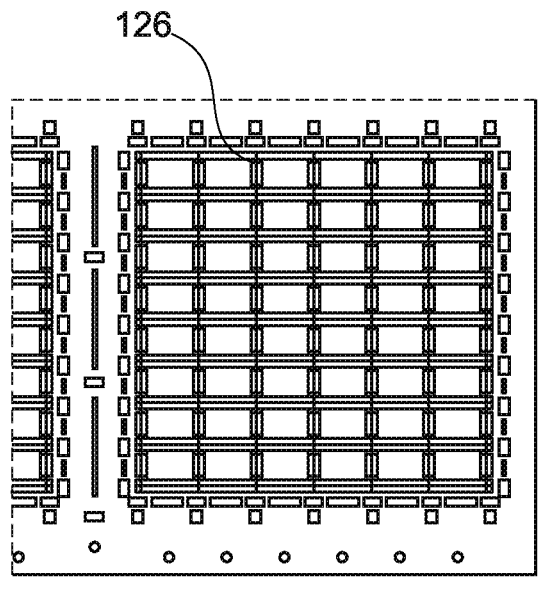

Referring to FIG. 20, an alternative to the ink-jet printing process for masking is illustrated. According to FIG. 20, selective masking may be realized by lamination, followed by a photo imaging process.

Referring to FIG. 21, a full etch process may be executed following the processing according to FIG. 20, as described above referring to FIG. 19.

FIG. 22 and FIG. 23 show obtained results of the final plating (for forming surface finish 114) and the sawing (for singulating packages 100) processes.

FIG. 24 illustrates three-dimensional top and bottom views of a package 100 according to another exemplary embodiment.

As shown, the package 100 is locally thinned at each of sidewall recesses 110 up to a remaining package thickness D being preferably in a range from 0.125 mm to 1 mm, for instance 0.5 mm. In other words, a remaining thickness D of the package 100 at a respective one of the sidewall recesses 110 may be in the mentioned range. Preferably, a lateral depth L of the respective sidewall recess 110 may be in a range from 0.1 mm to 4 mm, for example 1 mm.

More generally, the illustrated recesses 110 extend up to a lateral depth L into the vertical sidewalls of the package 100. In a vertical direction, the recesses 110 extend up to an upper main surface of the package 100, but not up to a lower main surface of the package 100. Therefore, the recesses 110 are groove-shaped.

The package 100 according to FIG. 24 is shown without tie bar 126. As a leadframe material for forming the first electrically conductive structure 106, copper of a thickness of for example 0.5 mm may be used.

As can be taken from the top view and the bottom view of FIG. 24, the creepage distance along which a creepage current has to flow to connect the first electrically conductive structure 106 with the second electrically conductive structure 108 is a+b+L. For example, a corresponding design specification or requirement may be that the creepage distance is at least 3.2 mm to provide a reliable creepage current protection. As shown, "a" is a spacing of the drain terminal of the second electrically conductive structure 108 up to an edge of the encapsulant 104 at which the respective recess 110 is formed. Moreover, "b" is the overall thickness of the package 100 at said edge. As mentioned above, "L" is the horizontal extension of the recess 110 into the package 100. Formation of recesses 110 in the described way may thereby improve the electric reliability by increasing the creepage distance.

In view of the advantageous effects of the recesses 110 what concerns the robustness against creepage current flow, it may be possible to increase the drain area compared with a package design without tie bar via post mold etch.

A package 100 according to an exemplary embodiment may thus be appropriate for an electric voltage of 600 V or above, for instance for a high-voltage GaN package.

The formation of the recesses 110 by etching a tie bar metal may simplify and accelerate also a singulation sawing process, for instance from 10 mm/sec to 200 mm/sec, since the sawing blade will only have to cut through mold material, not through metallic material.

Figure 25:
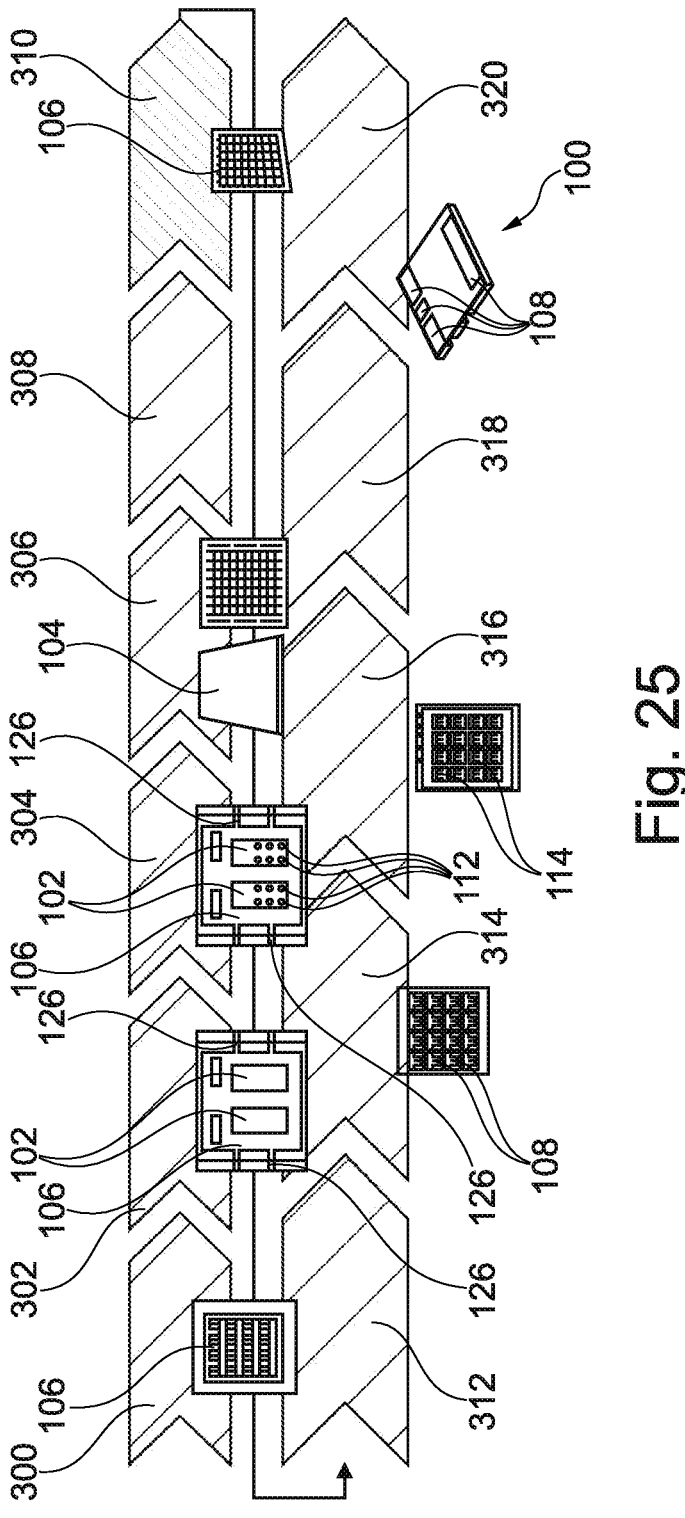
FIG. 25 illustrates processes of a method of manufacturing a package according to an exemplary embodiment.

FIG. 25 illustrates processes of a method of manufacturing a package 100 according to an exemplary embodiment.

According to FIG. 25, an incoming leadframe (see reference sign 300) may be subjected to a die assembly process, see reference sign 302. Thereafter, a bumping process or a pillar connection process may be executed for providing electrically conductive elements 112, see reference sign 304. After that, a molding process may be carried out for creating encapsulant 104, see reference sign 306. This may be followed by a mold flashing process for removing mold residues to expose electrically conductive structures 106. Thereafter, post mold etching may be carried out (compare reference sign 310) for removing tie bars 126 which previously connected neighboring die paddles. In a subsequent process according to reference sign 312, a selective coating, for instance a thin organic resin, may be applied to the mold compound or encapsulant 104. This may involve plateable mold compound technology (PMT). Thereafter, a laser direct structuring (LDS) process may be carried out in the context of copper plating (compare reference sign 314). Plating on plateable mold compound may then be executed, see reference sign 316. In an optional process indicated with reference sign 318, a solder mask may be formed on a surface of the package 100 for defining solderable and non-solderable surface regions. Again, this may involve a PMT process. In a process indicated with reference sign 320, individual packages 100 may be singulated.

Optionally, an isolation layer may be selectively deposited on part of the surface of the pre-form of the package 100 after the process according to reference sign 316 and before the process according to reference sign 318. This may further enhance the isolation properties of the package 100.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
an electronic component;
an encapsulant encapsulating at least part of the electronic component;
a first electrically conductive structure arranged on one side of the electronic component;
a second electrically conductive structure arranged on an opposing other side of the electronic component and being electrically coupled with the electronic component; and
at least one sidewall recess at the encapsulant, wherein the sidewall recess extends up to only one of two opposing main surfaces of the encapsulant, and wherein the sidewall recess exposes a sidewall portion of the first electrically conductive structure; and
wherein the first electrically conductive structure and the second electrically conductive structure are configured to be at different electric potentials during operation of the package, and wherein the first electrically conductive structure and the second electrically conductive structure are exposed at opposing main surfaces of the encapsulant.

2. The package according to claim 1, wherein the at least one sidewall recess comprises at least two sidewall recesses arranged at opposing sidewalls of the encapsulant.

3. The package according to claim 1, wherein the at least one sidewall recess comprises at least two sidewall recesses arranged mutually spaced at the same sidewall of the encapsulant.

4. The package according to claim 1, comprising at least one of the following features:
wherein the package is locally thinned at the at least one sidewall recess to a thickness of not more than 4 mm, in particular to a thickness in a range from 0.125 mm to 1 mm;
wherein a lateral depth of the at least one sidewall recess is not more than 4 mm, in particular is in a range from 0.1 mm to 4 mm.

5. The package according to claim 1, comprising at least one electrically conductive coupling element coupling the electronic component with the second electrically conductive structure.

6. The package according to claim 1, comprising one of the following features:
wherein the first electrically conductive structure comprises a carrier;
wherein the first electrically conductive structure comprises a clip.

7. The package according to claim 1, comprising at least one of the following features:
wherein the second electrically conductive structure comprises at least one plated structure;
wherein the encapsulant is a plateable mold compound.

8. The package according to claim 1, wherein an exposed portion of the first electrically conductive structure and/or an exposed portion of the second electrically conductive structure comprises a surface finish.

9. The package according to claim 1, comprising one of the following features:
wherein the package is tie bar-less;
comprising at least one tie bar stub being integrally formed with the first electrically conductive structure and being exposed at the at least one sidewall recess.

10. The package according to claim 1, wherein the electronic component comprises a transistor chip.

11. The package according to claim 10, wherein the first electrically conductive structure forms a source terminal and the second electrically conductive structure forms a drain terminal of the transistor chip, wherein in particular the second electrically conductive structure additionally forms a gate terminal of the transistor chip.

12. The package according to claim 10, comprising a further transistor chip being at least partially encapsulated by the encapsulant.

13. The package according to claim 11, wherein the second electrically conductive structure additionally forms a source terminal of the further transistor chip.

14. The package according to claim 10, wherein the transistor chip and the further transistor chip have a common gate terminal and/or have a common drain terminal.

15. The package according to claim 1, comprising one of the following features:
wherein the first electrically conductive structure is electrically coupled with the electronic component;
wherein the first electrically conductive structure is not electrically coupled with the electronic component.

16. A method of manufacturing a package, the method comprising:
encapsulating at least part of an electronic component by an encapsulant;
arranging a first electrically conductive structure on one side of the electronic component;
arranging a second electrically conductive structure on an opposing other side of the electronic component so as to be electrically coupled with the electronic component, wherein the first electrically conductive structure and the second electrically conductive structure are configured to be at different electric potentials during operation of the package, and wherein the first electrically conductive structure and the second electrically conductive structure are exposed at opposing main surfaces of the encapsulant; and
forming at least one sidewall recess in the encapsulant which is unfilled and exposed to an exterior of the package.

17. The method according to claim 16, wherein the method comprises forming the at least one sidewall recess by etching.

18. The method according to claim 16, wherein the method comprises forming the at least one sidewall recess by removing material of a tie bar temporarily interconnecting the first electrically conductive structure with a further electrically conductive structure during part of the method of manufacturing the package.

\* \* \* \* \*